United States Patent [19]

Platzöder

[11] 4,187,517
[45] Feb. 5, 1980

[54] SEMICONDUCTOR COMPONENT

[75] Inventor: Karl Platzöder, Haimhausen, Fed. Rep. of Germany

[73] Assignee: Siemens Aktiengesellschaft, Berlin & Munich, Fed. Rep. of Germany

[21] Appl. No.: 869,247

[22] Filed: Jan. 13, 1978

[30] Foreign Application Priority Data

Mar. 11, 1977 [DE] Fed. Rep. of Germany ....... 2710701

[51] Int. Cl.² .......................................... H01L 29/167
[52] U.S. Cl. ........................................ 357/64; 357/38; 357/90
[58] Field of Search ..................... 357/38, 64, 90

[56] References Cited

U.S. PATENT DOCUMENTS 3,440,113  4/1969  Wolley ..................................... 357/64
3,625,781  12/1971  Joshi et al. ............................. 357/64

Primary Examiner—Joseph E. Clawson, Jr.
Attorney, Agent, or Firm—Hill, Van Santen, Steadman, Chiara & Simpson

[57] ABSTRACT

A semiconductor thyristor, having a given forward voltage drop, has its turn-off time or the reverse current behavior adjusted in a defined manner and a reduced blocking current. Essentially, the semiconductor element is divided, at its anode end, into zone elements having a high and a low concentration of recombination centers, whereby, at the anode end, zones not oppositely disposed from the emitter receive a lower average concentratin of recombination centers. The invention is most advantageous when applied to power thyristors.

3 Claims, 4 Drawing Figures

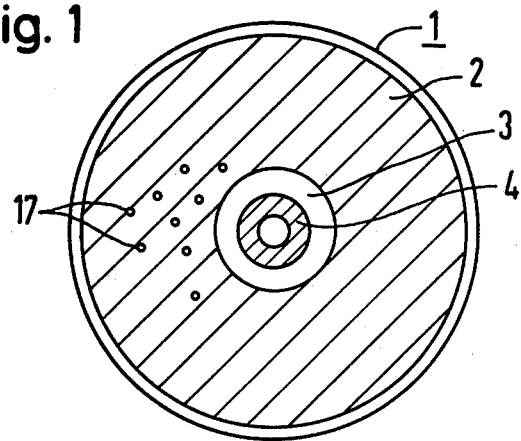
Fig. 1
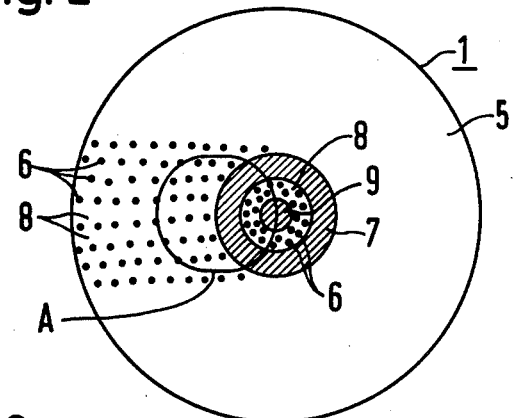
Fig. 2
Fig. 3
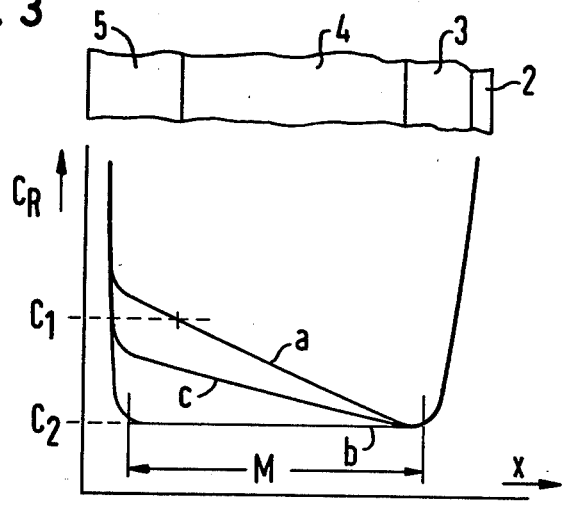

SEMICONDUCTOR COMPONENT

BACKGROUND OF THE INVENTION

1. Field of the Invention

The present invention relates to a semiconductor component, and is more particularly concerned with a power thyristor.

2. Description of the Prior Art

A semiconductor component of the general type with which the present invention is concerned is disclosed in the British patent application No. 24,028. A semiconductor body has at least two zones of alternately opposed conductivity type, whose anode is connected over the entire surface to an anode electrode and has recombination centers in the semiconductor body. At least one layer, which serves to getter the recombination centers is arranged on the cathode. A drop in the concentration of the recombination centers occurs from the anode and cathode side toward a central zone which is divided, at least on the anode side, into zone elements which exhibit different concentrations of recombination centers. The ratio of the zone elements is set to be such that in the central zone, the anode-side mean value of the concentration of the recombination centers is higher than the cathode-side mean value of the concentration of the recombination centers.

A semiconductor component of this type can, for example, consist of a thyristor or a diode. The semiconductor body of a thyristor generally possesses four zones of alternately opposite conductivity type, with a pn junction arranged therebetween. The pn junction between the outer and inner anode-side zone is the blocking pn junction across which the major part of the blocking voltage drops. The semiconductor body of a power diode fundamentally possesses two zones of opposite conductivity type. The semiconductor bodies of such semiconductor components have a specific content of recombination centers which serve to influence basic electrical properties, for example the turn-off time of the component. The aforementioned recombination centers are generally heavy metal atoms, such as gold, platinum, or manganese.

The processes employed in the production of the abovementioned semiconductor components entail the gettering of a specific part of the introduced recombination centers in layers close to the surface. These are, for example, in particular layers highly doped by boron or phosphorus, or layers close to the surface whose crystal construction is considerably disturbed by mechanical processing. As a result of the gettering, there is a reduction in the concentration of the recombination centers in the semiconductor body beneath the getter layers. If uniformly gettering layers are arranged at the anode side and the cathode side, the concentration of the recombination centers exhibits a U-shaped, symmetrical profile over the thickness of the semiconductor body. If, on the other hand, as a result of a lesser disturbance of the surface, a weaker gettering effect prevails at the anode side than at the cathode side, at the anode side the concentration of the recombination centers is higher than at the cathode side and the aforementioned profile becomes asymmetrical.

For many applications it is desirable to deliberately set an asymmetry so that a determinate gradient of the concentration of the recombination centers forms in the central zone. "Central zone" is to be understood to be that zone within the semiconductor body which lies between the two flanks of the U-shaped profile, i.e. between the steeply ascending gradients of the concentration. The absolute degree of the concentration of the recombination centers can be set by the quantity of recombination centers which is diffused into the semiconductor material. However, it is not possible to influence the symmetry of the profile of the concentration of recombination centers so as to be reproducible either by controlling the quantity of recombination centers or by controlling the diffusion parameters during the diffusion process.

The concentration of recombination centers at the blocking pn junction of a thyristor and at the pn junction of a diode fundamentally determines, for example, the reverse current characteristics of a semiconductor component of this type. By virtue of the selection of the gradient of the concentration of the recombination centers in the central zone it is possible to produce semiconductor components which, with a predetermined forward voltage drop, have either a shorter turn-off time or a more favorable reverse current characteristic, and to produce components which have a symmetrical profile of the concentration of recombination centers.

In the aforementioned British patent application, it has been proposed that the gradient of the concentration of the recombination centers be set in that the anode-side region of the central zone be divided into zone elements having differing concentrations of recombination centers, and that the ratio of the zone elements be set to be such that in the central zone the anode-side mean value of the concentration of recombination centers is higher than the cathode-side mean value.

It has now been established that with an arrangement of this type, relatively high blocking currents could be noted, in particular when the entire anode-side was divided into the aforementioned zone elements.

SUMMARY OF THE INVENTION

The primary object of the present invention is to provide an improved semiconductor component of the type mentioned above in which the blocking current is reduced without any undesirable change occuring in the ratio of the turn-off time to the forward voltage.

This object is achieved in that only a part of the central zone is divided into the zone elements and that the remainder of the zone possesses a concentration of recombination centers which is lower than the concentration value established by the division into zone elements.

Advantageously, in a semiconductor body for a thyristor, which has a control electrode, a central zone is divided into zone elements and the remainder of the zone has a concentration of recombination centers which is lower than the concentration mean value set by the division into zone elements and the remainder lies opposite the control electrode.

According to an advantageous embodiment of the invention, in a semiconductor body for a thyristor which has a control electrode, an auxiliary emitter, and a main emitter, the aforementioned remainder lies opposite the control electrode and the surface between the main emitter and the auxiliary emitter.

BRIEF DESCRIPTION OF THE DRAWINGS

Other objects, features and advantages of the invention, its organization, construction and operation will be best understood from the following detailed description taken in conjunction with the accompanying drawings, on which:

FIG. 1 is a plan view of a semiconductor body of a thyristor as seen from the cathode side of the thyristor;

FIG. 2 is a plan view of the semiconductor body of FIG. 1, shown from the anode-side of the thyristor;

FIG. 3 is a graphic illustration of the doping concentration over a thickness x of the semiconductor body.

DESCRIPTION OF THE PREFERRED EMBODIMENTS

Figure 4:
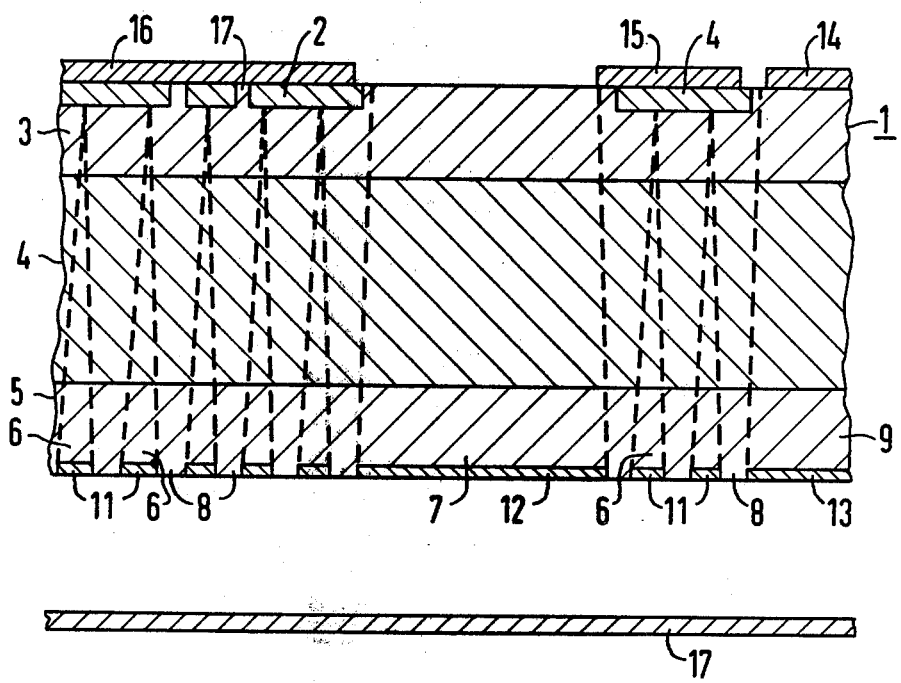
FIG. 4 is a sectional view through a semiconductor body illustrating the division into the zone elements and the remainder of the zone in the application of the semiconductor body to a thyristor.

Referring to FIG. 1, a thyristor comprises a semiconductor body 1, and emitter 2, a base 3 and an auxiliary emitter 4. The emitter 2, hereinafter referred to as the main emitter, and the auxiliary emitter 4, have been illustrated by hatching to improve the clarity. The main emitter 2 is provided with short-circuits 17, of which only a few have been illustrated on the drawing.

FIG. 2 illustrates the same semiconductor body as viewed from the anode side, on which the anode is referenced 5. A plurality of zone elements 6 is illustrated in which the concentration of recombination centers is low compared with the concentration of recombination centers of the zone elements 8 located between the zone elements 6. The anode 5 also has zones 7, 9 which, like the zone elements 6, exhibit a relatively low concentration of recombination centers. The zone 9 is arranged opposite the cathode-side surface provided for the control electrode, and the zone 7 lies opposite the surface arranged between the main emitter 2 and the auxiliary emitter 4. In the case of thyristors which do not have an auxiliary emitter, the zone 7 can be omitted. The zones 7, 9 are illustrated by hatching for improved clarity.

The zone elements 6 and the zones 7, 9 are produced by getter layers which themselves receive a high concentration of recombination centers, as a result of which an impoverishment of recombination centers occurs beneath the getter layers, therefore in particular in the central zone. The zone elements 8 have a comparatively high concentration. The ratio of the size of the zone elements 6, 8 relative to one another governs a doping concentration mean value which is represented in FIG. 3. In FIG. 3, the lateral mean values of possible concentration curves of recombination centers $C_R$ are plotted with respect to the thickness x of the semiconductor body of a thyristor. Here, three characteristic doping profiles a, b and c have been illustrated. For reasons of clarity and simplicity, the diagram of FIG. 3 has been assigned a simplified section through the semiconductor body which has the main emitter zone 2, the base 3, the auxiliary emitter zone 4, and the anode 5. Under the condition that the anode side of the semiconductor body and the cathode side of the semiconductor body are gettered to an equal extend, a fundamentally symmetrical curve b of the doping concentration having a concentration $C_2$ occurs in the central zone M. If the cathode side outer zone 2 is gettered considerably more strongly than the anode side outer zone 5, the concentration curve a is set. This is fundamentally the case whenever the zone 2 has been highly doped, for example, with phosphorus or boron and the zone 5 contains a comparatively low concentration of dopants. The mean value of the gradient of the doping concentration of the recombination centers in the semiconductor body can be set by means of the size of the zone elements 6, 8 and the zones 7, 9 on the anode of the semiconductor body. In this manner, it is possible to set the turn-off time or the reverse current characteristic of a semiconductor component having a predetermined on-state resistance.

The zone elements 6 and the zones 7, 9 can be produced, for example, in such a manner that, employing a known masking process, phosphorous or boron is diffused in high concentration into those points at which the aforementioned zones are to be located. Phosphorous or boron layers in a high concentration, as mentioned above, act as getter layers so that there is a reduction in the concentration of recombination centers beneath the getter layers in the semiconductor body. Beneath the control electrode and the surface line between the main emitter and the auxiliary emitter, there have arisen comparatively large zones 7, 9 which have a relatively low concentration of recombination centers. This is favorable because, at the cathode side, no phosphorous or boron can diffuse in beneath the control electrode and on the surface between the main emitter and the auxiliary emitter, i.e. a relatively low doping concentration prevails, and therefore the gettering effect is very weak at the cathode side and is governed only by disturbances in the crystal structure on the surface. Therefore, without the strong anode side gettering, a high concentration of recombination centers would occur beneath the aforementioned cathode side surfaces and would produce an increase in the off-state current. Therefore, in addition to setting the gradient of the doping concentration of recombination centers, it is also possible to achieve a reduction in the off-state current, in particular beneath the control electrode and beneath the surface between the main emitter and the auxiliary emitter.

FIG. 4 represents a section of a portion of the semiconductor body of FIGS. 1 and 2. This portion is referenced A in FIG. 2. In FIG. 4, the zone elements 6 and the zones 7, 9 of relatively weak recombination center concentration have been schematically illustrated the latter are narrow in the direction toward the cathode, but completely penetrate through the semiconductor body if the width of the zone elements and the zones lies in the order of the thickness of the semiconductor body. In FIG. 4 the thickness of the semiconductor body has been exaggerated for clarity, although in reality this thickness and the width of the zone elements can, for example, be 500 μm. The zone elements 8 which have a relatively high concentration of recombination centers lie between the zone elements 6, and between the zone elements 6 and the zones 7 and 9. It can be seen that the semiconductor body has a low recombination center concentration in particular between the main emitter 2 and the auxiliary emitter 4, and beneath the control electrode 14. This low concentration is also evident in the anode side region of the central zone (M in FIG. 3), i.e. at the blocking pn junction between the zones 4 and 5, so that there is an effective reduction in the blocking currents, in particular at these points, and therefore overall. The zone elements 6 and the zones 7, 9 can be produced, for example, by providing a plurality of zones 11, 12, 13 which are highly doped with phosphorous or boron, the production of which is known per se. The main emitter 2 is connected to an emitter electrode 16, and the auxiliary emitter 4 is connected to an auxiliary emitter electrode 15. At the anode side, an electrode 17 is alloyed on, for example with aluminum. If the zones 11, 12 and 13 have been produced by phosphorous diffusion, which results in n conductivity, this is over-compensated by the aluminum alloy and therefore no additional pn junctions form at the anode side. However, the heavily doped, anode side zones could also be mechanically removed, for example, prior to contacting.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A semiconductor component comprising a semiconductor body having at least two zones of alternately opposite conductivity type, an anode electrode, an anode connected to said anode electrode along the entire surface of said body, a cathode, said body including recombination centers therein and at least one layer for gettering the recombination centers upon said cathode, said body including a recombination center characteristic in which there is a drop in the concentration of recombination centers from the anode side and cathode side toward a central zone, said central zone being divided, at least on the anode side, into zone elements exhibiting differing concentrations of recombination centers, the ratio of the zone elements being set such that in the central zone the anode side mean value of the concentration of recombination centers is higher than the cathode side mean value of the concentration of recombination centers, said central zone including a first portion which is divided into said zone elements and a remainder portion which possesses a concentration of recombination centers which is lower than the concentration mean value determined by the division of said first portion into said zone elements.

2. A semiconductor component as claimed in claim 1, in a thyristor comprising a control electrode, said remainder portion lying opposite said control electrode.

3. A semiconductor component as claimed in claim 1, in a thyristor comprising a control electrode, a main emitter, and an auxiliary emitter, and wherein said remainder portion lies opposite said control electrode and the surface between said auxiliary emitter and said main emitter.

* * * * *